United States Patent
Sethi

(10) Patent No.: US 9,208,864 B2
(45) Date of Patent: Dec. 8, 2015

(54) SEMICONDUCTOR MEMORY WITH INTEGRATED BIOLOGIC ELEMENT

(71) Applicant: Toshiba America Electronic Components, Inc., San Jose, CA (US)

(72) Inventor: Rakesh Sethi, San Jose, CA (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 84 days.

(21) Appl. No.: 14/052,988

(22) Filed: Oct. 14, 2013

(65) Prior Publication Data
US 2015/0103591 A1    Apr. 16, 2015

(51) Int. Cl.
  G11C 11/54   (2006.01)
  G11C 11/56   (2006.01)
  G11C 13/00   (2006.01)
  G11C 13/04   (2006.01)

(52) U.S. Cl.
  CPC ........ *G11C 11/5664* (2013.01); *G11C 13/0019* (2013.01); *G11C 13/04* (2013.01); *G11C 2013/008* (2013.01)

(58) Field of Classification Search
  USPC ........................................................ 365/167
  See application file for complete search history.

(56) References Cited

U.S. PATENT DOCUMENTS

| | | | |
|---|---|---|---|
| 5,228,001 A | 7/1993 | Birge | |
| 5,253,198 A | 10/1993 | Birge | |
| 5,559,732 A | 9/1996 | Birge | |
| 6,067,246 A * | 5/2000 | Heller et al. | 365/151 |
| 8,008,653 B2 * | 8/2011 | Lee et al. | 257/40 |
| 8,450,716 B2 * | 5/2013 | Tran | 257/5 |
| 8,733,099 B2 * | 5/2014 | Torres-Jara et al. | 60/528 |
| 2007/0285843 A1 * | 12/2007 | Tran | 360/245.9 |
| 2009/0070721 A1 * | 3/2009 | Solomon | 716/8 |
| 2010/0084741 A1 * | 4/2010 | Andres et al. | 257/536 |
| 2013/0090260 A1 * | 4/2013 | Nova et al. | 506/9 |
| 2013/0140649 A1 * | 6/2013 | Rogers et al. | 257/414 |
| 2013/0294180 A1 * | 11/2013 | Litsyn et al. | 365/189.011 |

OTHER PUBLICATIONS

The Students from Fowler High School, Syracuse, New York "Protein Based Memory Storage".

* cited by examiner

*Primary Examiner* — Hoai V Ho
*Assistant Examiner* — Pablo Huerta
(74) *Attorney, Agent, or Firm* — Ulmer & Berne LLP

(57) ABSTRACT

A memory includes cytokines, such as macromolecule proteins, as a poly-state data storage. Each fold state of multiple fold states of a protein are associated with a data value. Current flow through the protein is associated with a resistance of the protein associated with its current fold state. Application of light, electric fields or heat via an associated element or elements facilitates placement of a protein in a fold state that corresponds to an associated resistance and correlates with an incoming data value. Measuring of current or resistance allows for reading of a data value associated with the protein.

18 Claims, 4 Drawing Sheets

SEMICONDUCTOR MEMORY WITH INTEGRATED BIOLOGIC ELEMENT

TECHNICAL FIELD

The subject application is directed generally to digital data storage. The application includes embodiments wherein data storage is accomplished by integration of semiconductors with biologic elements, such as proteins.

BACKGROUND

Historically, tangible and humanly perceivable media was used to store information and works of authorship. More recently, computer programs and data have been stored in digital memory. Volatile memory holds data as long as power is applied. Non-volatile memory holds data after power has been removed. Current digital memory has evolved from magnetic core, to transistor-based logic. Bulk memory includes hard disks, CDs, DVDs, flash memory, and the like. Data storage capacity of digital systems continues to grow with improvements in data storage. However, even with advances in memory storage density, the amount of digital data continues to grow.

Early data storage was largely limited to computer programs and associated data. Today, books, artwork, CAD drawings, photographs, music and video are all stored digitally. New works are continuously being created, and preexisting, tangible works are scanned or otherwise digitized and stored. Improved resolution, such as higher video, picture or sound resolution requires even greater storage than prior digitization of the same work. This creates an even greater need for increased storage density, storage or retrieval speed, or cheaper storage alternatives.

OVERVIEW OF EXAMPLE EMBODIMENTS

Figure 1:
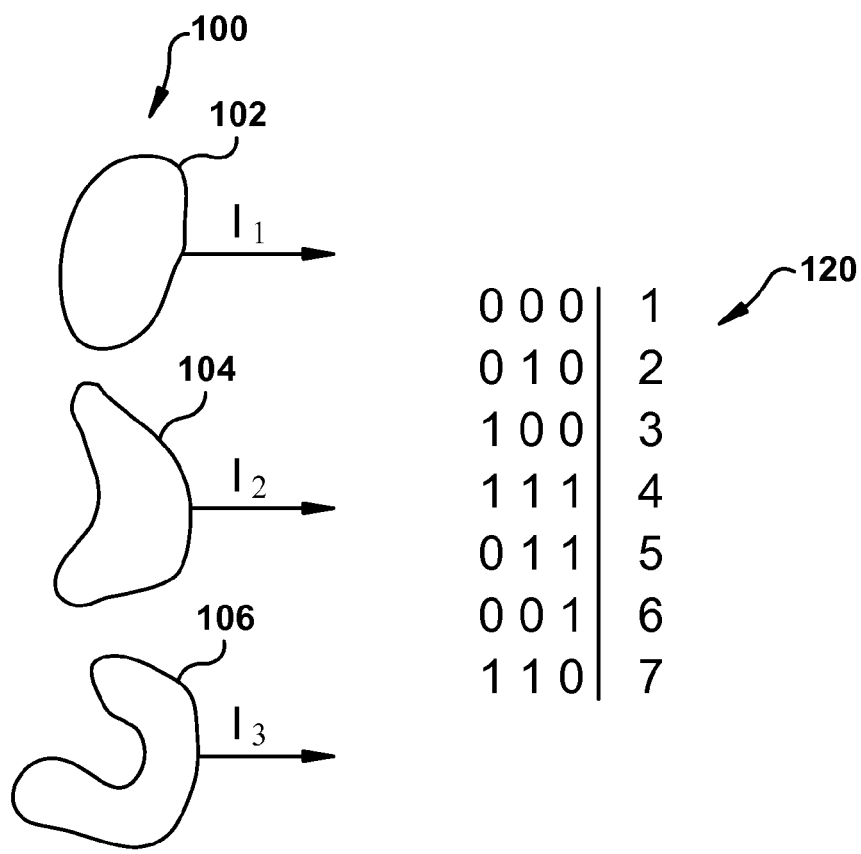
FIG. 1 illustrates an example embodiment of a biological cytokine wherein folding corresponds to a binary value.

The following presents a simplified overview of the example embodiments in order to provide a basic understanding of some aspects of the example embodiments. This overview is not an extensive overview of the example embodiments. It is intended to neither identify key or critical elements of the example embodiments nor delineate the scope of the appended claims. Its sole purpose is to present some concepts of the example embodiments in a simplified form as a prelude to the more detailed description that is presented later.

In an example embodiment as disclosed herein, a semiconductor substrate is associated with a biological cytokine. The cytokine has at least three folding states and each folding state is associated with a unique, relative electrical resistance. A conductor to communicate current to the cytokine and an electrical output receives current from the cytokine. An energy source selectively communicates radiant energy to the cytokine in accordance with a regulator that is operable to set a level of the radiant energy to at least three levels, with each level being associated with a unique folding state of the cytokine. A sensor senses a current level of the output, and this sensed current level is used to generate a binary data corresponding to each folding state and its associated current level.

In another example embodiment, a method of storing data includes communicating current to a biological cytokine to which a first level of radiant energy is applied. A first current associated with the first level is sensed from an output from the cytokine. A first digital value is generated in accordance with a sensed current output associated with the first level. A second level of radiant energy is applied to the cytokine and a second current output from the cytokine associated with the second level is sensed. A second digital value is generated in accordance with a sensed current output associated with the second level.

In another example embodiment, an array of biological cytokines is disposed on a semiconductor substrate. A data input operable to receive a multi-bit binary number value and an address input is operable to receive a memory address. A regulator sets a level of the radiant energy to at least three levels, with each level being associated with a unique folding state of the cytokine. A selector selects a subset of the cytokines in accordance with a received memory address. An energy source controlled by the regulator selectively communicates radiant energy to the subset of cytokines in accordance with a received multi-bit binary value.

DESCRIPTION OF EXAMPLE EMBODIMENTS

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

FIG. 1 illustrates an example of a cytokine 100 in three states of folding. Suitable cytokines are comprised of biological macromolecules such as proteins, peptides, or glycoproteins. Cytokine 100 is illustrated in three states of distinct folding, including a relatively unfolded state 102, an intermediate folded state 104 and a relatively folded state 106. It will be appreciated that different cytokines, such as different proteins, may comprise a number of distinct fold positions at which they are stable relative to a surrounding conditions to which they are exposed as will be detailed further below. From example 120 of FIG. 1, three distinct fold states suitably represent three logic levels, such as may be associated many-valued, or n-state logic wherein n has a value of three, wherein n is suitably any integer greater than 1.

Many-valued logic is advantageous in connection with memory devices insofar as more information is suitably stored in a smaller area. Many-valued data are also suitable for use in conjunction with arithmetic circuits, Field Programmable Gate Arrays (FPGA) and the like. Many-valued logic is further able to function with fewer interconnections, and function with less power.

Also illustrated in FIG. 1 is an example of an association of binary values corresponding to an 8-state logic suitably associated with a cytokine having eight unique and detectable fold positions. It will be appreciated that any number of fold states is suitably implemented, and available in accordance with a type of macromolecule and its associated, available folding states.

Figure 2:
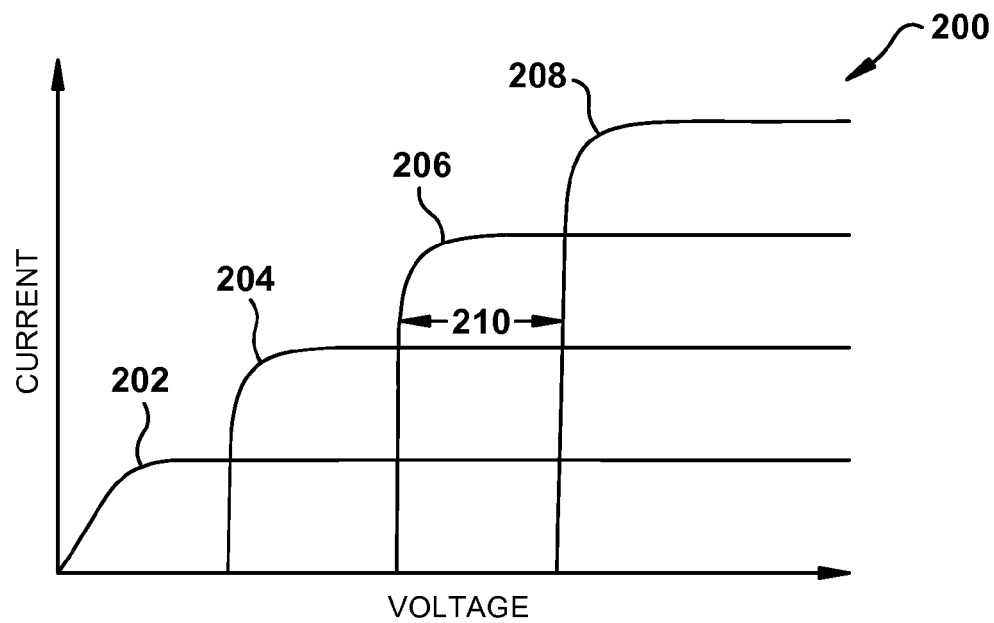
FIG. 2 illustrates an example of a resistance curve associated with different fold levels for a biological cytokine.

FIG. 2 illustrates an example 200 of a resistance curve that is associated with an example cytokine, such as a foldable protein. It will be noted that, in the illustration, current that passes through a particular protein is a function of applied voltage. It will be further noted that, in the example protein, four different resistance plateaus, 202, 204, 206 and 208 are illustrated. Each plateau is relatively stable over an associate voltage range, such as range 210 associated with plateau 206. Thus, each plateau is suitably associated with a corresponding many-valued logic state.

Figure 3:
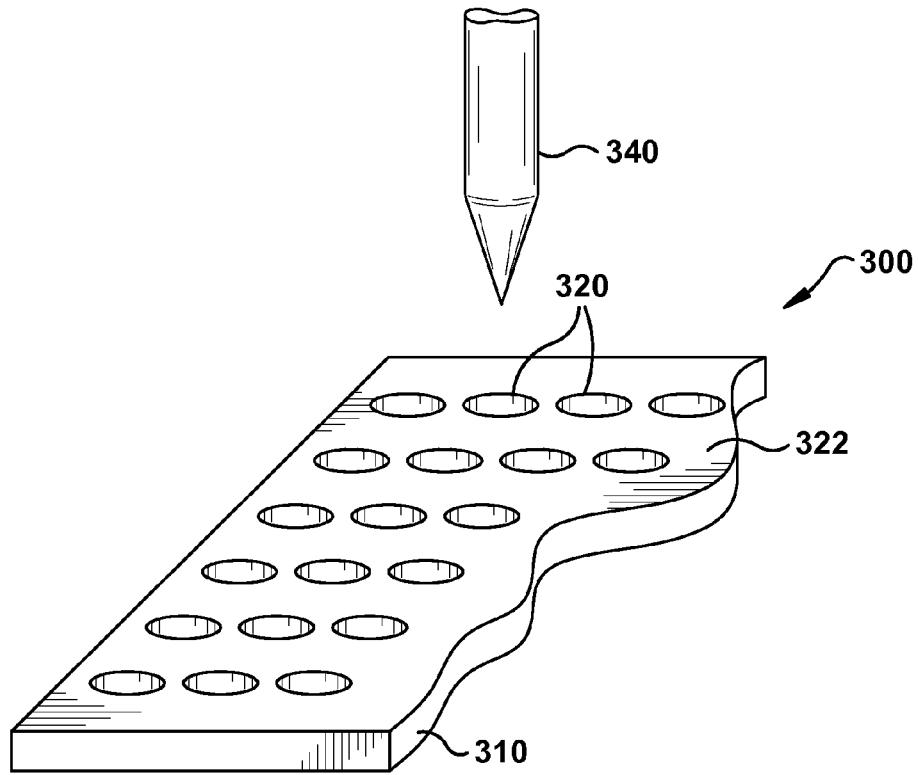
FIG. 3 illustrates an example of an array of biological molecules assembled in connection with a semiconductor substrate.

Turning now to FIG. 3, illustrated is an example inclusive of a micro array 300, including a semiconductor substrate 310 that defines a plurality of openings 320 on a surface 322 thereof. Substrate 310 is suitably comprised of any semiconductor material compatible with integrated circuit fabrication, including but not limited to silicon, germanium, gallium-arsenide, or the like. In the illustration, openings 320 are depicted as concave depressions. It will be appreciated that any surface preparation suitable for receipt of a cytokine, including linear surface etching, is suitably implemented. It will be appreciated that a semiconductor substrate is suitably fabricated to also include discrete electronic components, such as diodes, transistors or resistors, as well as conductive layers of aluminum and copper. Suitable logic and electrical interconnection are associated with each opening 320 to facilitate formation of a conductive path through a cytokine that is introduced therein. Proteins are suitably deposited in the openings 320 by an automated inserter 340. Fabrication is completed analogously to fabrication of DNA microarrays as will be appreciated by one of ordinary skill in the art. In another embodiment, proteins are suitably deposited in accordance with implementation of an associated 3D printer.

Figure 4:
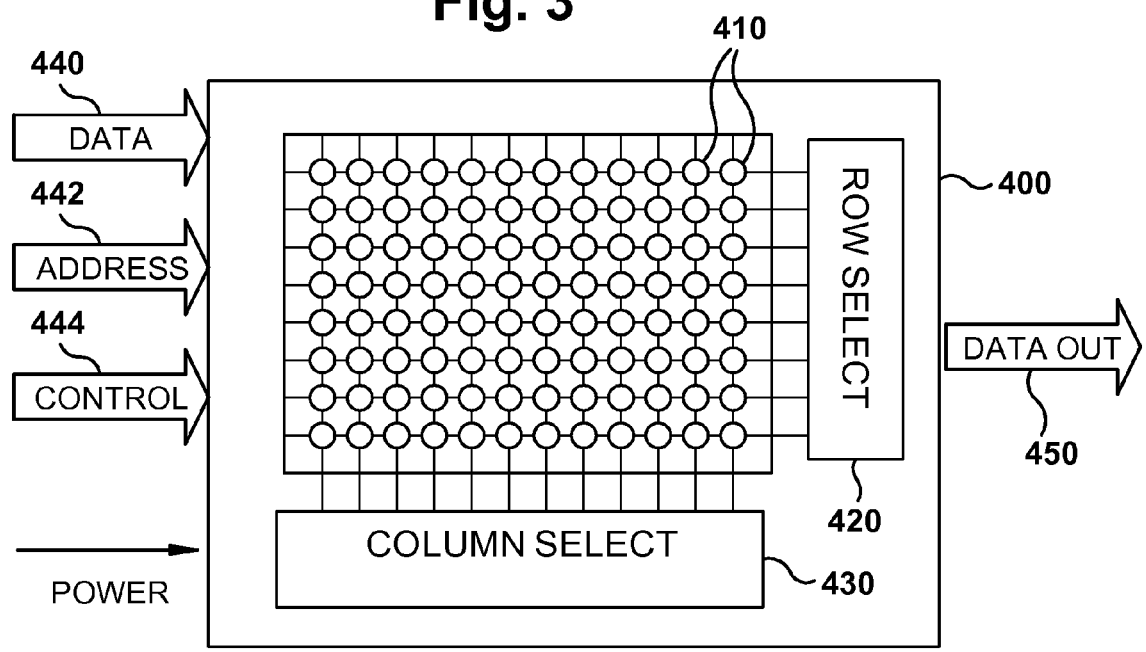
FIG. 4 illustrates an example of a memory array composed of biological molecules.

FIG. 4 illustrates an example of a memory array 400. Included in the array 400 are a plurality of cytokines 410 functioning as memory elements, suitably arranged in a rectangular array by rows and columns. With the example array arrangement, a particular memory element or elements is selectable by enabling conductors via row select logic 420 and column select logic 430. A data input 440 suitably receives data for storage in the array 400, along with an address for storage via address input 442. During an example write cycle, row select 420 and column select 430 enable reads or writes to a particular subset of cytokines associated with an incoming address. Control 444 suitably indicates that a memory write operation is desired, and corresponding cytokines are placed in a corresponding folding state so as to store the same. Similarly, if control 444 indicates that a read operation is occurring, cytokines associated with the incoming address are selected via row select 420 and column select 430, and fold level is determined, suitably in accordance with a current resistance level, facilitating a data read at that address, and that data is suitably communicated to data output 450.

Figure 5:
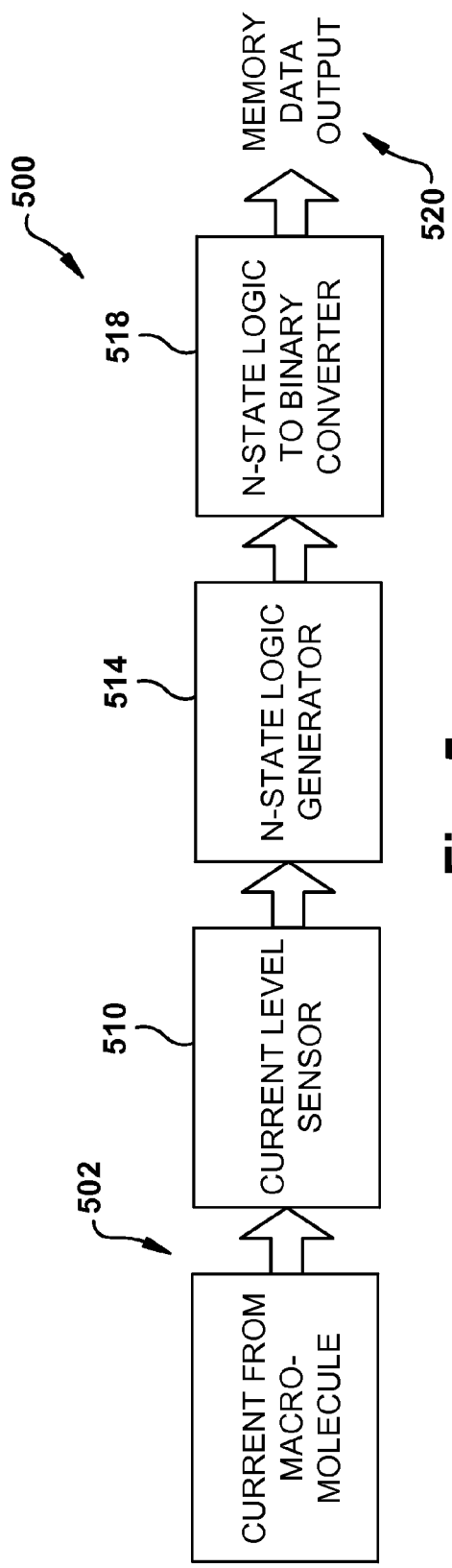
FIG. 5 illustrates an example of a system for reading a memory value from information associated with a cytokine.

Turning now to FIG. 5, illustrated is system 500 operable to receive current from a cytokine, such as a macromolecule at input 502. A current level sensor 510 functions to determine a current level, which current level will provide a resistance indicator when associated with a voltage, such as a voltage drop across an associated macromolecule, in accordance with Ohm's law: V=RI. Level or levels of current or resistance is associated with a N-state logic value at logic generator 514. A conversion to binary values is suitably made at binary converter 518, which conversion generates a memory data output at 520.

Figure 6:
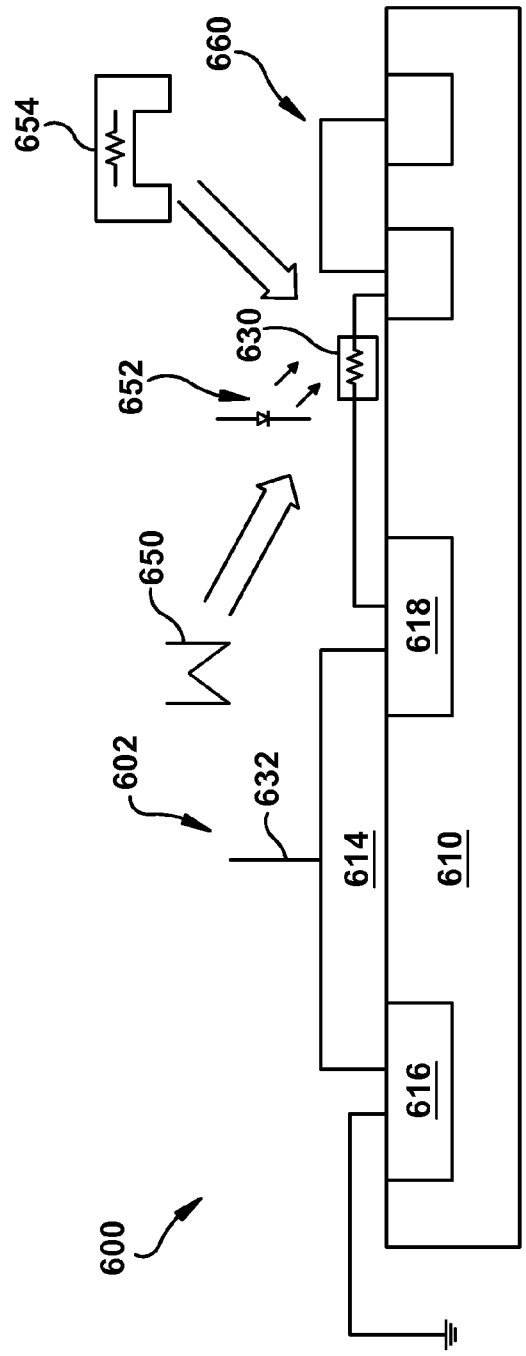
FIG. 6 illustrates an example of a transistor including an associated cytokine.

Illustrated in FIG. 6 is an example of a semiconductor memory device 600, such as one including a CMOS field effect transistor (FET) at 602. The illustration is suitably N-type or P-type, and is formed on a semiconductor substrate. In the illustrated embodiment, the FET includes a gate 614, a source 616 and a drain 618. The drain forms in input to a cytokine, such as a biologic macromolecule or macromolecules 630. The macromolecule component 630 is suitably associated with substrate 610 in a manner as detailed above. From the forgoing, it will be appreciated that current flowing into the macromolecule component 630 is controllable in accordance with a voltage applied to gate 614 by an associated gate lead 632. Reading, writing or erasing of a fold state of a macromolecule, such as a protein, is suitably accomplished in accordance with exposure to excitation energy or a magnetic field. Such excitation energy is suitably associated with an electric field, heat, light, or any electromagnetic radiation. Particular relationships between input current to the macromolecule component 630, excitation energy levels or magnetic field levels, and output current are dependent on each particular macromolecule selected, which selection is dictated by a particular application or environment.

FIG. 6 further illustrates examples of excitation energy generators, include a heat source 650, a light source 652 or a magnetic field source 654. In certain situations, combinations of two or more sources are suitably implemented. Sources are suitably integrated with or on semiconductor substrate 610. By way of example, if light source 652 is comprised of a light-emitting diode, such diode may be fabricated by appropriate doping or coating of the substrate 610. In another example, heating elements or magnetic elements are suitably deposited on and affixed to the substrate 610, or an associated conductive or insulating layer, in accordance with conventional integrated circuit fabrication techniques or 3D printing system. An output of the macromolecule component is suitably communicated to another circuit element, such as another FET transistor, such as that indicated generally at 660, for amplification. An output from the associated memory element is routed in accordance with the explanation above.

Certain cytokines, such as protein macromolecules, can be induced to a default fold position by application of sufficient excitation energy or magnetic field. Concurrent control of multiple components, such as heat source 650, light source 652 or magnetic field source 654, relative to multiple macromolecule components in an array functions to concurrently place all similar components into the same fold state. Defining this fold state at a zero or null level provides a result of a bulk erase of many components. This is suitably accomplished by concurrently activating all magnetic energy or magnetic field components, or via a large, centralized system that exposes multiple macromolecule components.

Figure 7:
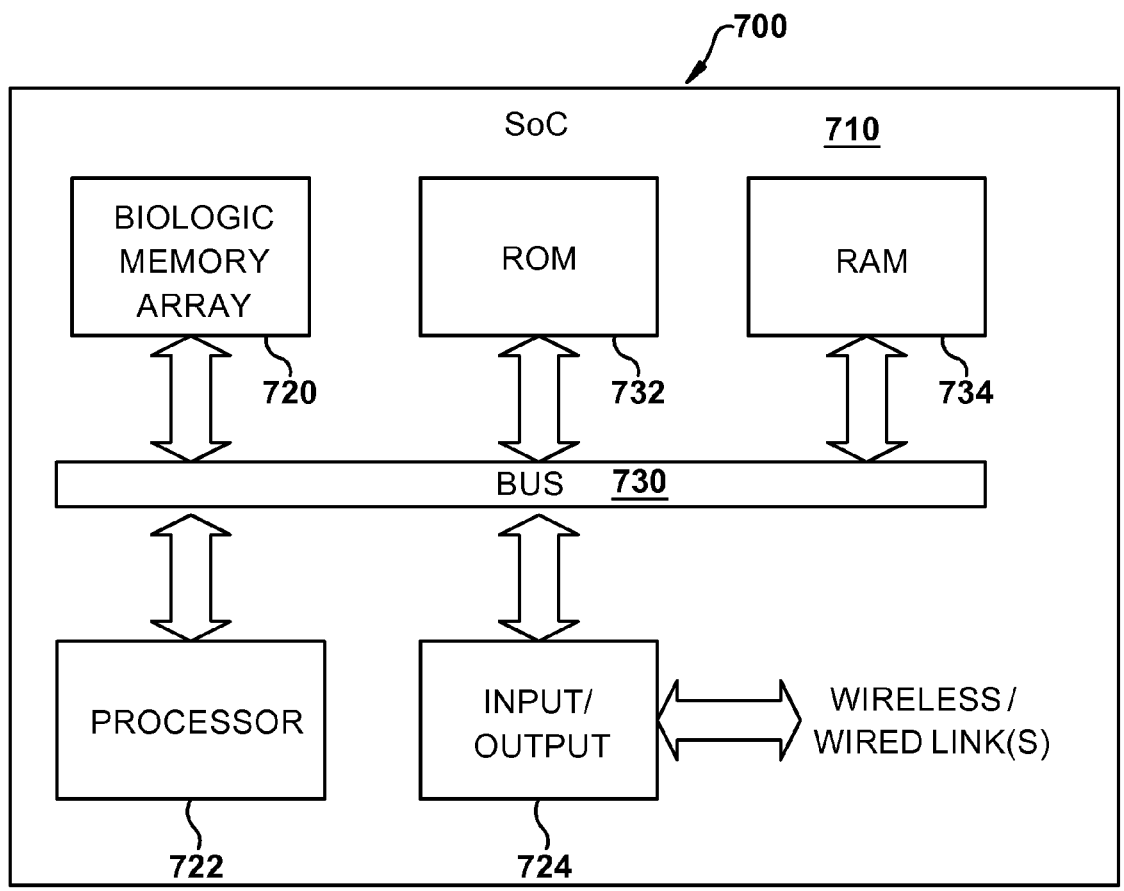
FIG. 7 illustrates an example of a computer system implementing a biologic memory array.

FIG. 7 illustrates an example of a computer system 700 implementing a biologic memory array as described herein. The computer is suitably formed as a System-on-Chip as in SoC 710. Computer system 700 suitably includes a biologic memory array 720, a processor 722 and in input/output unit 724 in data communication via a bus 730. Computer system 700 also suitably includes conventional memory such as read-only memory 732 or random access memory 734.

Described above are example embodiments. It is, of course, not possible to describe every conceivable combination of components or methodologies, but one of ordinary skill in the art will recognize that many further combinations and permutations of the example embodiments are possible. Accordingly, this application is intended to embrace all such alterations, modifications and variations that fall within the spirit and scope of the appended claims interpreted in accordance with the breadth to which they are fairly, legally and equitably entitled.

The invention claimed is:

1. An apparatus comprising:
a semiconductor substrate;
a cytokine disposed on the substrate, the cytokine having at least three associated folding states wherein each folding state is associated with a unique, relative electrical resistance;
a conductor operable to communicate current to the cytokine;
an electrical output operable to receive current from the cytokine;
an energy source operable to selectively communicate radiant energy to the cytokine;
a regulator operable to set a level of the radiant energy to at least three levels, each level being associated with a unique folding state of the cytokine;
a sensor operable to sense a current level of the output; and
a data output operable to generate a binary value corresponding to each folding state and its associated current level.

2. The apparatus of claim 1 wherein the cytokine is comprised of a protein.

3. The apparatus of claim 2 wherein the energy source is comprised of a heat generator associated with the semiconductor substrate.

4. The apparatus of claim 2 wherein the energy source is comprised of a light generator associated with the semiconductor substrate.

5. The apparatus of claim 2 wherein the energy source is comprised of an electromagnet associated with the semiconductor substrate.

6. A method comprising:
communicating current to a cytokine;
applying a first level of radiant energy to the cytokine;
sensing a first current output from the cytokine associated with the first level;
generating a first digital value in accordance with a sensed current output associated with the first level;
applying a second level of radiant energy to the cytokine;
sensing a second current output from the cytokine associated with the second level;
generating a second digital value in accordance with a sensed current output associated with the second level;
applying a third level of radiant energy to the cytokine;
sensing a third current output from the cytokine associated with the third level; and
generating a third digital value in accordance with a sensed current output associated with the third level.

7. The method of claim 6 further comprising generating a tri-state logic level in accordance with the first, second and third digital values.

8. The method of claim 7 further comprising converting the first, second and third digital values to a binary value.

9. The method of claim 8 further comprising:
receiving a multi-bit binary input; and
generating the first, second and third levels of radiant energy in accordance with the multi-bit binary input.

10. A method comprising:
communicating current to a cytokine;
applying a first level of radiant energy to the cytokine;
sensing a first current output from the cytokine associated with the first level;
generating a first digital value in accordance with a sensed current output associated with the first level;
applying a second level of radiant energy to the cytokine;
sensing a second current output from the cytokine associated with the second level; and
generating a second digital value in accordance with a sensed current output associated with the second level; and
wherein each step of applying radiant energy includes the step of applying radiant energy comprised of heat.

11. A method comprising:
communicating current to a cytokine;
applying a first level of radiant energy to the cytokine;
sensing a first current output from the cytokine associated with the first level;
generating a first digital value in accordance with a sensed current output associated with the first level;
applying a second level of radiant energy to the cytokine;
sensing a second current output from the cytokine associated with the second level; and
generating a second digital value in accordance with a sensed current output associated with the second level; and
wherein each step of applying radiant energy includes the step of applying radiant energy comprised of a magnetic field.

12. An apparatus comprising:
an array of biological cytokines disposed on a semiconductor substrate;
a data input operable to receive a multi-bit binary number value;
an address input operable to receive a memory address;
a regulator operable to set a level of radiant energy to at least three levels, each level being associated with a unique folding state of the cytokine;
an selector operable to select a subset of the cytokines in accordance with a received memory address; and
an energy source controlled by the regulator and operable to selectively communicate radiant energy to the subset of cytokines in accordance with a received multi-bit binary value.

13. The apparatus of claim 12 further comprising:
an electrical input operable to communicate current to each cytokine of the subset;
an electrical output operable to receive current from each cytokine of the subset;
a sensor operable to sense a level of current from each cytokine of the subset in accordance with current received from the electrical output; and
a data output operable to generate, for each cytokine of the array, a binary value corresponding a current level associated therewith.

14. The apparatus of claim 12 wherein the cytokine is comprised of a protein.

15. The apparatus of claim 12 wherein the energy source is comprised of a heat generator associated with the semiconductor substrate.

16. The apparatus of claim 12 wherein the energy source is comprised of a light generator associated with the semiconductor substrate.

17. The apparatus of claim 12 wherein the energy source is comprised of an electromagnet associated with the semiconductor substrate.

18. The apparatus of claim 14 further comprising a processor disposed on the semiconductor substrate, the processor having an address bus operable to communicate the multi-bit binary value and a data bus operable to communicate the memory address.

* * * * *